US011240070B1

(12) United States Patent
Lin et al.

(10) Patent No.: US 11,240,070 B1
(45) Date of Patent: Feb. 1, 2022

(54) DIGITAL ISOLATOR

(71) Applicant: Feature Integration Technology Inc., Hsinchu (TW)

(72) Inventors: Hung-Hao Lin, Hsinchu (TW); Tsung-Wei Li, Hsinchu (TW)

(73) Assignee: Feature Integration Technology Inc., Hsinchu (TW)

( * ) Notice: Subject to any disclaimer, the term of this patent is extended or adjusted under 35 U.S.C. 154(b) by 0 days.

(21) Appl. No.: 17/113,099

(22) Filed: Dec. 6, 2020

(30) Foreign Application Priority Data

Oct. 30, 2020 (TW) ................................. 109137870

(51) Int. Cl.
| | | |
|---|---|---|
| H04L 25/02 | (2006.01) | |
| H04B 1/44 | (2006.01) | |
| H04L 27/06 | (2006.01) | |
| H02M 3/06 | (2006.01) | |
| H04B 5/00 | (2006.01) | |
| H03K 5/24 | (2006.01) | |
| H03F 3/45 | (2006.01) | |
| H04L 27/04 | (2006.01) | |

(52) U.S. Cl.
CPC .......... *H04L 25/0268* (2013.01); *H02M 3/06* (2013.01); *H03F 3/45179* (2013.01); *H03K 5/2481* (2013.01); *H04B 1/44* (2013.01); *H04B 5/0012* (2013.01); *H04L 27/04* (2013.01); *H04L 27/06* (2013.01)

(58) Field of Classification Search
CPC ..... H04L 25/0268; H04L 27/04; H04L 27/06; H02M 3/06; H03F 3/45179; H03K 5/2481; H04B 1/44; H04B 5/0012
See application file for complete search history.

(56) References Cited

U.S. PATENT DOCUMENTS

| | | | | |
|---|---|---|---|---|
| 3,859,624 A | * | 1/1975 | Kriofsky | G08G 1/017 340/941 |
| 3,870,943 A | * | 3/1975 | Weischedel | H02M 3/3378 363/26 |
| 4,138,635 A | * | 2/1979 | Quinn | G03G 15/0283 323/293 |
| 4,529,947 A | * | 7/1985 | Biard | H01L 27/0802 257/E27.047 |

(Continued)

FOREIGN PATENT DOCUMENTS

| | | |
|---|---|---|
| TW | 201419649 A | 5/2014 |
| TW | I460919 B | 11/2014 |

*Primary Examiner* — James M Perez

(57) ABSTRACT

A digital isolator provided includes a pair of transceiver circuits and a control circuit. Each transceiver circuit includes a transmitter circuit, a receiver circuit, and a DC isolation circuit. When the control circuit controls one of the pair of transceiver circuits to operate in a transmitting mode and the other of the pair of transceiver circuits to operate in a receiving mode, the transmitting circuit of the transceiver circuit operating in the transmitting mode receives a square wave signal to generate a pair of differential square wave signals, the connected DC isolation circuits receive the pair of differential square wave signals to generate a pair of differential coupling signals, and the transceiver circuit operating in the receiving mode uses the pair of differential coupling signals to output the square wave signal through the design of a pair of feedback voltage divider circuits and a differential comparison circuit included therein.

11 Claims, 11 Drawing Sheets

(56) References Cited

U.S. PATENT DOCUMENTS

| | | | | |
|---|---|---|---|---|
| 4,545,076 A * | 10/1985 | Biard | H04B 10/693 | 257/E27.047 |
| 4,637,073 A * | 1/1987 | Selin | G01S 7/034 | 330/134 |
| 4,973,174 A * | 11/1990 | Losie | G05F 1/70 | 318/608 |
| 5,550,507 A * | 8/1996 | Hori | H03D 1/04 | 329/361 |
| 5,864,456 A * | 1/1999 | Connor | H02H 7/005 | 361/93.7 |
| 6,259,745 B1 * | 7/2001 | Chan | H04B 3/23 | 370/294 |
| 6,417,737 B1 * | 7/2002 | Moloudi | H03B 21/01 | 330/301 |
| 6,738,601 B1 * | 5/2004 | Rofougaran | H03B 21/01 | 327/427 |
| 6,788,131 B1 * | 9/2004 | Huang | G05F 3/30 | 327/539 |
| 6,917,789 B1 * | 7/2005 | Moloudi | H03B 21/01 | 333/103 |
| 6,920,311 B2 * | 7/2005 | Rofougaran | H03B 21/01 | 327/427 |
| 6,970,022 B1 * | 11/2005 | Miller | H03K 3/3565 | 327/205 |
| 6,987,966 B1 * | 1/2006 | Wu | H03B 21/01 | 375/147 |
| 7,015,716 B2 * | 3/2006 | Chen | H02M 3/1588 | 324/764.01 |
| 7,200,176 B1 * | 4/2007 | Paulos | H04L 25/0266 | 375/257 |
| 7,256,632 B2 * | 8/2007 | Chen | H02M 3/1588 | 327/175 |
| 7,468,547 B2 * | 12/2008 | Harvey | H01L 23/495 | 257/666 |
| 7,664,976 B2 * | 2/2010 | Chen | G06F 1/324 | 713/322 |
| 7,697,628 B2 * | 4/2010 | Choi | H04L 25/085 | 375/288 |
| 7,705,661 B2 * | 4/2010 | Li | G05F 3/262 | 327/538 |
| 8,080,865 B2 * | 12/2011 | Harvey | H01L 23/645 | 257/666 |
| 8,446,977 B2 * | 5/2013 | Ovchinnikov | H04B 3/50 | 375/288 |
| 8,472,532 B2 * | 6/2013 | Schley-May | H04B 1/10 | 375/258 |
| 8,493,893 B2 * | 7/2013 | Morong | H04B 5/0093 | 370/276 |
| 8,798,216 B2 * | 8/2014 | Pullela | H04L 25/08 | 375/349 |
| 8,836,374 B2 * | 9/2014 | Hadji-Abdolhamid | H03K 19/00 | 327/54 |
| 8,848,337 B2 * | 9/2014 | Keane | G11C 13/0002 | 361/437 |
| 8,897,735 B2 * | 11/2014 | Kim | H04B 1/525 | 455/295 |
| 9,007,096 B1 * | 4/2015 | Carey | H03K 5/2481 | 327/65 |
| 9,473,329 B1 * | 10/2016 | Edwards | H04L 25/0268 | |
| 9,577,708 B1 * | 2/2017 | McClellan | H04B 1/40 | |
| 9,584,022 B1 * | 2/2017 | Galvano | H05B 45/3725 | |
| 9,601,995 B1 * | 3/2017 | Mukherjee | G01R 19/04 | |
| 9,602,317 B1 * | 3/2017 | Hailu | H03F 3/45183 | |
| 9,621,383 B1 * | 4/2017 | Urienza | H04L 25/085 | |
| 9,660,848 B2 * | 5/2017 | Yun | H03B 5/1228 | |
| 9,685,923 B2 * | 6/2017 | Candage | H04B 15/00 | |
| 9,698,728 B2 * | 7/2017 | Kamath | H04L 25/0268 | |
| 9,768,978 B2 * | 9/2017 | Coenen | H04L 12/403 | |
| 9,893,924 B2 * | 2/2018 | Smail | H04L 27/265 | |
| 9,941,999 B1 * | 4/2018 | Milesi | G01R 29/02 | |
| 9,985,615 B2 * | 5/2018 | Feng | H03K 5/01 | |
| 10,027,358 B2 * | 7/2018 | Wu | H04B 1/1018 | |
| 10,135,626 B2 * | 11/2018 | Pischl | H04L 12/10 | |
| 10,236,932 B1 * | 3/2019 | Briano | G01R 33/09 | |
| 10,291,275 B2 * | 5/2019 | Lee | H04L 25/0298 | |
| 10,367,462 B2 * | 7/2019 | Marques | H01L 27/0727 | |
| 10,594,367 B1 * | 3/2020 | Bhagwat | H04L 12/40045 | |
| 10,601,614 B1 * | 3/2020 | Liu | H04B 1/0475 | |
| 10,633,246 B2 * | 4/2020 | Kaija | B81B 7/0064 | |
| 10,673,477 B2 * | 6/2020 | Li | H04B 1/1607 | |
| 10,826,438 B2 * | 11/2020 | Lin | H03F 1/302 | |
| 10,840,960 B1 * | 11/2020 | Al-Shyoukh | H04B 1/16 | |
| 10,871,757 B2 * | 12/2020 | Kallikuppa | G05B 19/0423 | |
| 10,892,911 B2 * | 1/2021 | Wojciechowski | H04L 12/40039 | |
| 11,057,003 B2 * | 7/2021 | Ripley | H03F 1/0227 | |
| 11,070,137 B2 * | 7/2021 | Carden | H02M 3/01 | |
| 11,075,779 B2 * | 7/2021 | Yu | H04L 25/0212 | |
| 2002/0136321 A1 * | 9/2002 | Chan | H04B 3/23 | 375/295 |
| 2003/0090313 A1 * | 5/2003 | Burgener | H03K 19/018521 | 327/408 |
| 2003/0132805 A1 * | 7/2003 | Horikawa | H03L 7/099 | 331/17 |
| 2004/0195917 A1 * | 10/2004 | Rofougaran | H03L 7/18 | 307/109 |
| 2004/0239487 A1 * | 12/2004 | Hershbarger | H04L 5/14 | 375/258 |
| 2005/0153664 A1 * | 7/2005 | Moloudi | H03H 21/0012 | 455/78 |
| 2005/0179498 A1 * | 8/2005 | Tsutsui | H03G 3/3047 | 330/285 |
| 2005/0186925 A1 * | 8/2005 | Rofougaran | H03F 3/245 | 455/197.2 |
| 2006/0018388 A1 * | 1/2006 | Chan | H04B 3/23 | 375/257 |
| 2006/0033455 A1 * | 2/2006 | Chen | H05B 41/2825 | 315/300 |
| 2007/0085608 A1 * | 4/2007 | Iriguchi | H03F 3/45183 | 330/260 |
| 2007/0138971 A1 * | 6/2007 | Chen | H05B 39/045 | 315/209 R |
| 2008/0031286 A1 * | 2/2008 | Alfano | H04B 3/548 | 370/535 |
| 2008/0278255 A1 * | 11/2008 | Harvey | H01L 23/66 | 333/12 |
| 2008/0278256 A1 * | 11/2008 | Harvey | H01L 24/49 | 333/12 |
| 2010/0027169 A1 * | 2/2010 | Knott | H02J 1/14 | 361/18 |
| 2012/0098031 A1 * | 4/2012 | Wang | H01L 29/0626 | 257/168 |
| 2012/0272045 A1 * | 10/2012 | Chuang | G06F 9/505 | 712/214 |
| 2013/0093240 A1 * | 4/2013 | Lin | H02J 7/0042 | 307/11 |
| 2013/0169196 A1 * | 7/2013 | Markham | H02P 7/00 | 318/3 |
| 2014/0118982 A1 * | 5/2014 | Roessler | H02J 7/0014 | 361/807 |
| 2014/0211862 A1 * | 7/2014 | Moghe | H04B 5/0012 | 375/256 |
| 2015/0280785 A1 * | 10/2015 | Brauchler | H04B 5/0031 | 257/531 |
| 2015/0381219 A1 * | 12/2015 | Kramer | H03F 1/02 | 375/297 |
| 2016/0080182 A1 * | 3/2016 | Yun | H04L 25/08 | 375/320 |
| 2016/0080183 A1 * | 3/2016 | Yun | H03K 5/2481 | 375/320 |
| 2016/0087780 A1 * | 3/2016 | Goswami | H04L 27/08 | 370/498 |
| 2016/0191001 A1 * | 6/2016 | Ripley | H03F 1/22 | 375/219 |
| 2017/0019069 A1 * | 1/2017 | Dunsmore | H03F 1/0211 | |
| 2018/0269272 A1 * | 9/2018 | Cook | H01L 23/66 | |
| 2018/0332415 A1 * | 11/2018 | Quan | H04R 3/04 | |
| 2019/0007012 A1 * | 1/2019 | Marques | H03F 3/45179 | |

(56) References Cited

U.S. PATENT DOCUMENTS

| | | | |
|---|---|---|---|
| 2019/0089402 A1* | 3/2019 | Zihir | H01Q 3/46 |
| 2019/0181764 A1* | 6/2019 | Pentakota | H01L 21/4853 |
| 2019/0181817 A1* | 6/2019 | Al-Shyoukh | H02J 50/80 |
| 2020/0153390 A1* | 5/2020 | Lin | H03F 1/302 |
| 2021/0124234 A1* | 4/2021 | Vitic | G02F 1/0123 |
| 2021/0314716 A1* | 10/2021 | Quan | H04R 29/001 |

* cited by examiner

DIGITAL ISOLATOR

CROSS REFERENCE TO RELATED APPLICATION

This application claims the priority benefit of Taiwan Patent Application Serial Number 109137870, filed on Oct. 30, 2020, the full disclosure of which is incorporated herein by reference.

BACKGROUND

Technical Field

The present disclosure relates to an isolator, more particularly to a digital isolator.

Related Art

When a signal or energy is transmitted from a circuit of one voltage domain to a circuit of another voltage domain, due to the difference in the voltage domain, the signal may interfere with or damage the peripheral circuits during the transmission process. Therefore, an isolator is usually configured to protect the circuits for transmitting signals between the circuits in different voltage domains, and improve the reliability of the circuits.

At present, the digital isolators usually use an on-off keying (OOK) modulation scheme. When a signal inputted to a digital isolator is in low voltage level, the digital isolator outputs an oscillating signal; when a signal inputted to a digital isolator is in high voltage level, there is no signal output from the digital isolator. Although the oscillating signal has a relatively high frequency and it is easier for the oscillating signal to pass through the isolation circuit, there are problems that the square wave signal that can inputted to the digital isolator has a relatively low frequency, and the signal is easily affected by noise due to the large attenuation during transmission.

SUMMARY

In view of the above, the present disclosure provides a digital isolator to solve the problems of the prior art that the square wave signal that can inputted to the digital isolator has a relatively low frequency, and the signal is easily affected by noise due to the large attenuation during transmission.

The present disclosure provides a digital isolator, which includes a pair of transceiver circuits and a control circuit. Each of the pair of transceiver circuits operates in one of a receiving mode and a transmitting mode, and includes a direct current (DC) isolation circuit, and a transmitting circuit and a receiving circuit connected to the DC isolation circuit. Each receiving circuit includes a first feedback voltage divider circuit, a second feedback voltage divider circuits, and a differential comparison circuit, to which the first feedback voltage divider circuit and the second feedback voltage divider circuit are respectively connected. The DC isolation circuits are connected to each other. The control circuit is connected to the pair of transceiver circuits for controlling one of the pair of transceiver circuits to operate in the transmitting mode, and controlling the other of the pair of transceiver circuits to operate in the receiving mode, so that the transmitting circuit of the transceiver circuit operating in the transmitting mode is configured to generate a positive differential square wave signal and a negative differential square wave signal after receiving a square wave signal from an input/output terminal of the digital isolator; the connected DC isolation circuits are configured to generate a positive differential coupling signal and a negative differential coupling signal after receiving the positive differential square wave signal and the negative differential square wave signal; and in the receiving circuit of the transceiver circuit operating in the receiving mode, the first feedback voltage divider circuit is configured to output a positive differential voltage division signal to the differential comparison circuit based on the positive differential coupling signal and a positive differential comparison signal, the second feedback voltage divider circuit is configured to output a negative differential voltage division signal to the differential comparison circuit based on the negative differential coupling signal and a negative differential comparison signal, and the differential comparison circuit is configured to compare the positive differential voltage division signal and the negative differential voltage division signal to feedback the positive differential comparison signal to the first feedback voltage divider circuit, feedback the negative differential comparison signal to the second feedback voltage divider circuit, and output the positive differential comparison signal which is the same as the square wave signal through the other input/output terminal of the digital isolator.

The digital isolator disclosed in the present disclosure can adjust its signal transmission direction according to user needs by the design of connecting two identical transceiver circuits to each other, and controlling one of the transceiver circuits to operate in the transmitting mode and the other of the transceiver circuits to operate in the receiving mode through the control circuit. In addition, the transmitting circuit, the receiving circuit and the DC isolation circuit of each transceiver circuit can be integrated, and the wires are configured to connect the two transceiver circuits to form the digital isolator disclosed in the present disclosure, so, in the production process of the digital isolator, there is no additional DC isolation circuit and no special manufacturing process required, thereby making the manufacturing process of digital isolators easier. Furthermore, the voltage difference between the circuits in different voltage domains that the digital isolator disclosed in the present disclosure can load is increased by the design of connecting two transceiver circuits with each other through the DC isolation circuits. Moreover, the digital isolator disclosed in the present disclosure can use the differential signal transmission technology of the transceiver circuits to solve the problems of the prior art that the square wave signal that can inputted to the digital isolator has a relatively low frequency, and the signal is easily affected by noise due to the large attenuation during transmission.

It should be understood, however, that this summary may not contain all aspects and embodiments of the present invention, that this summary is not meant to be limiting or restrictive in any manner, and that the invention as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

The present invention will now be described more fully hereinafter with reference to the accompanying drawings, in which exemplary embodiments of the invention are shown. This present invention may, however, be embodied in many different forms and should not be construed as limited to the embodiments set forth herein. Rather, these embodiments are provided so that this present invention will be thorough and complete, and will fully convey the scope of the present invention to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". In addition, the terms "coupling/coupled" and "connecting/connected" used in this specification (including claims) may refer to any direct or indirect connection means. For example, "a first device is connected to a second device" should be interpreted as "the first device is directly connected to the second device" or "the first device is indirectly connected to the second device through other devices or connection means." The following description is of the best-contemplated mode of carrying out the invention. This description is made for the purpose of illustration of the general principles of the invention and should not be taken in a limiting sense. The scope of the invention is best determined by reference to the appended claims.

Furthermore, it will be understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Moreover, use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1:
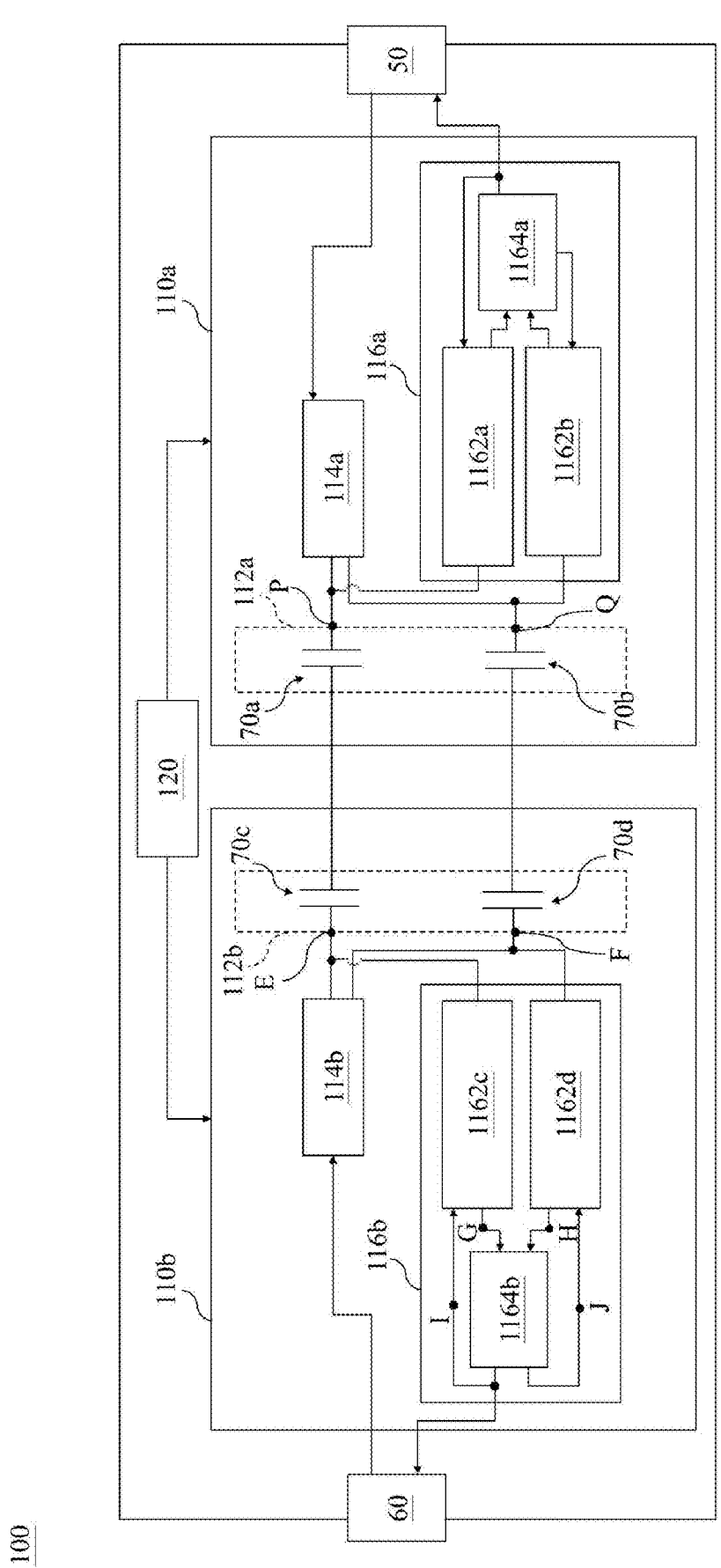
FIG. 1 is a schematic diagram of a digital isolator disclosed in a first embodiment of the present disclosure.

Please refer to FIG. 1. FIG. 1 is a schematic diagram of a digital isolator disclosed in a first embodiment of the present disclosure. In the embodiment, the digital isolator 100 may comprise a pair of transceiver circuits (i.e., a transceiver circuit 110a and a transceiver circuit 110b) and a control circuit 120, wherein the control circuit 120 is connected to the transceiver circuit 110a and the transceiver circuit 110b.

In the embodiment, both the transceiver circuit 110a and the transceiver circuit 110b can operate in one of the receiving mode and the transmitting mode (that is, each transceiver circuit can operate in one of the receiving mode and the transmitting mode). The transceiver circuit 110a may comprise a transmitting circuit 114a, a receiving circuit 116a, and a DC isolation circuit 112a connected to the transmitting circuit 114a and the receiving circuit 116a respectively; and the transceiver circuit 110b may comprise a transmitting circuit 114b, a receiving circuit 116b, and a DC isolation circuit 112b connected to the transmitting circuit 114b and the receiving circuit 116b respectively (that is, each transceiver circuit may comprise a transmitting circuit, a receiving circuit, and a DC isolation circuit connected to the transmitting circuit and the receiving circuit respectively). The DC isolation circuit 112a is connected to the DC isolation circuit 112b (that is, the DC isolation circuits are connected to each other). In more detail, the transmitting circuit 114a is connected to the receiving circuit 116b through the DC isolation circuit 112a and the DC isolation circuit 112b, and the receiving circuit 116a is connected to the transmitting circuit 114b through the DC isolation circuit 112a and the DC isolation circuit 112b (that is, the DC isolation circuit 112a and the DC isolation circuit 112b are between the transmitting circuit 114a and the receiving circuit 116b, and between the transmitting circuit 114b and the receiving circuit 116a).

Since signal transmissions between the transmitting circuit 114a and receiving circuit 116b and between the transmitting circuit 114b and receiving circuit 116a are through differential signals (i.e., differential square wave signals, differential coupling signals, differential comparison signals and differential voltage division signals), the DC isolation circuit 112a and the DC isolation circuit 112b may comprise a pair of coupling elements respectively. In the embodiment, the DC isolation circuit 112a may comprise a capacitor 70a and a capacitor 70b, and the DC isolation circuit 112b may comprise a capacitor 70c and a capacitor 70d. That is, each coupling element is a capacitor. In other words, the DC isolation circuit 112a and the DC isolation circuit 112b adopt the design of capacitive coupling isolation. In the embodiment, the capacitor 70a is connected to the capacitor 70c, and the capacitor 70b is connected to the capacitor 70d, the transmitting circuit 114a and the receiving circuit 116a are connected to the capacitor 70a and the capacitor 70b respectively, and the transmitting circuit 114b and the receiving circuit 116b are connected to the capacitor 70c and the capacitor 70d respectively. However, the embodiment is not intended to limit the present disclosure. For example, the aforementioned coupling element may also be an inductor. In other words, the DC isolation circuit 112a and the DC isolation circuit 112b may comprise a pair of inductors respectively, and adopt the design of magnetic coupling isolation.

In the embodiment, the receiving circuit 116a may comprise a first feedback voltage divider circuit 1162a, a second feedback voltage divider circuit 1162b, and a differential comparison circuit 1164a, and the receiving circuit 116b may comprise a first feedback voltage divider circuit 1162c, a second feedback voltage divider circuit 1162d, and a differential comparison circuit 1164b. In more detail, one side of the first feedback voltage divider circuit 1162a is connected to the capacitor 70a, and the other side of the first feedback voltage divider circuit 1162a is connected to the d differential comparison circuit 1164a; and one side of the second feedback voltage divider circuit 1162b is connected to the capacitor 70b, and the other side of the second feedback voltage divider circuit 1162b is connected to the differential comparison circuit 1164a; and one side of the first feedback voltage divider circuit 1162c is connected to the capacitor 70c, and the other side of the first feedback voltage divider circuit 1162c is connected to the differential comparison circuit 1164b; and one side of the second feedback voltage divider circuit 1162d is connected to the capacitor 70d, and the other side of the second feedback voltage divider circuit 1162d is connected to the differential comparison circuit 1164b.

It should be noted that there is a signal feedback mechanism between the first feedback voltage divider circuit 1162a and the differential comparison circuit 1164a, so that there are two connecting lines between the first feedback voltage divider circuit 1162a and the differential comparison circuit 1164a; there is a signal feedback mechanism between the second feedback voltage divider circuit 1162b and the differential comparison circuit 1164a, so that there are two connecting lines between the second feedback voltage divider circuit 1162b and the differential comparison circuit 1164a; there is a signal feedback mechanism between the first feedback voltage divider circuit 1162c and the differential comparison circuit 1164b, so that there are two connecting lines between the first feedback voltage divider circuit 1162c and the differential comparison circuit 1164b; there is a signal feedback mechanism between the second feedback voltage divider circuit 1162d and the differential comparison circuit 1164b, so that there are two connecting lines between the second feedback voltage divider circuit 1162d and the differential comparison circuit 1164b. The detailed signal feedback mechanisms can be described later.

In the embodiment, the control circuit 120 is connected to the transceiver circuit 110a and the transceiver circuit 110b, so that the control circuit 120 can be configured to control one of the transceiver circuit 110a and the transceiver circuit 110b to operate in the transmission mode, and control the other of the transceiver circuit 110a and the transceiver circuit 110b to operate in the receiving mode. The following embodiments are described in the situation that the control circuit 120 to control the transceiver circuit 110a to operate in the transmitting mode and control the transceiver circuit 110b to operate in the receiving mode.

Figure 2:
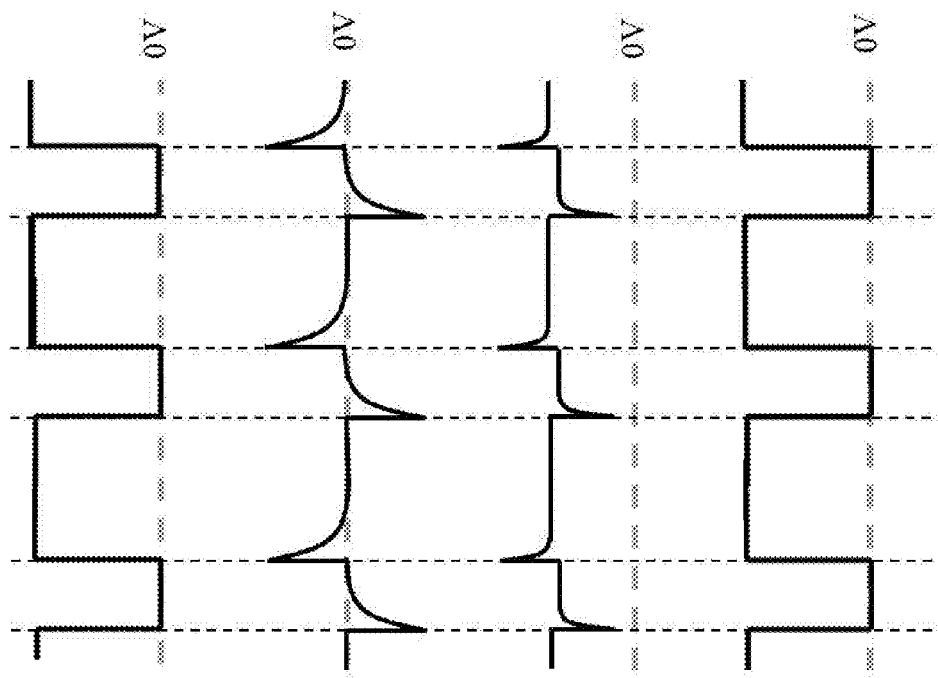
FIG. 2 is a schematic diagram of signal waveforms of each key node when the digital isolator of FIG. 1 transmits a signal in an embodiment of the present disclosure.
Figure 2:
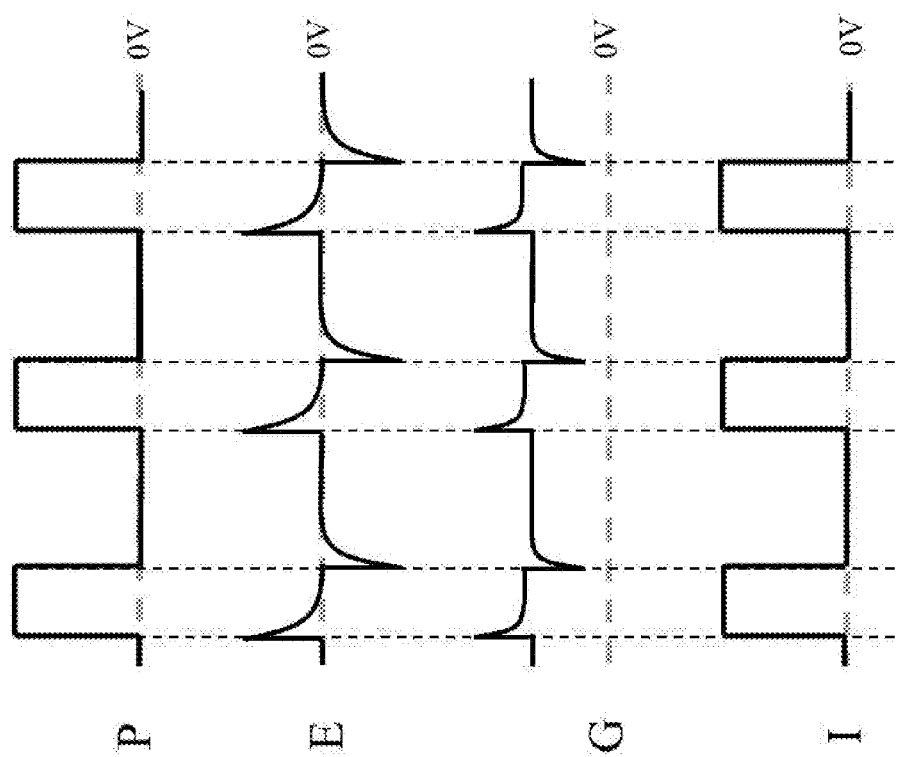

Please refer to FIG. 1 and FIG. 2. FIG. 2 is a schematic diagram of signal waveforms of each key node when the digital isolator of FIG. 1 transmits a signal in an embodiment of the present disclosure. In FIG. 2, the horizontal axis represents the time, the vertical axis represents the amplitude of the signal (e.g., the voltage level), and the horizontal dashed line represents the baseline where the amplitude of the signal is zero (e.g., the voltage level is zero volts (V)). When the transceiver circuit 110a operates in the transmitting mode and the transceiver circuit 110b operates in the receiving mode, the transmitting circuit 114a of the transceiver circuit 110a operating in the transmitting mode can be configured to generate a positive differential square wave signal and a negative differential square wave signal (i.e., the signal waveforms of node P and node Q in FIG. 1, as shown in FIG. 2) after receiving a square wave signal from an input/output terminal 50 of the digital isolator 100; and the DC isolation circuit 112a and the DC isolation circuit 112b connected can be configured to generate a positive differential coupling signal and a negative differential coupling signal after receiving the positive differential square wave signal and the negative differential square wave signal.

In the embodiment, since the DC isolation circuit 112a and the DC isolation circuit 112b adopt the design of capacitive coupling isolation, the positive differential coupling signal can be a positive differential surge signal, and the negative differential coupling signal can be a negative differential surge signal (i.e., the signal waveforms of node E and node F in FIG. 1, as shown in FIG. 2). In some embodiments, when the DC isolation circuit 112a and the DC isolation circuit 112b adopt the design of magnetic coupling isolation, the positive differential coupling signal can be a positive differential triangle signal, the negative differential coupling signal can be a negative differential triangle signal.

The first feedback voltage divider circuit 1162c of the transceiver circuit 110b operating in the receiving mode can be configured to output a positive differential voltage division signal (i.e., the signal waveforms of node G in FIG. 1, as shown in FIG. 2) to the differential comparison circuit 1164b based on the positive differential coupling signal and a positive differential comparison signal. The second feedback voltage divider circuit 1162d can be configured to output a negative differential voltage division signal (i.e., the signal waveforms of node H in FIG. 1, as shown in FIG. 2) to the differential comparison circuit 1164b based on the negative differential coupling signal and a negative differential comparison signal. The differential comparison circuit 1164b can be configured to compare the positive differential voltage division signal and the negative differential voltage division signal, and then feedback the positive differential comparison signal to the first feedback voltage divider circuit 1162c (i.e., the signal waveform of node I in FIG. 1, as shown in FIG. 2), and feedback the negative differential comparison signal to the second feedback voltage divider circuit 1162d (i.e., the signal waveform of node J in FIG. 1, as shown in FIG. 2), and output the positive differential comparison signal that is the same as the square wave signal through the input/output terminal 60 of the digital isolator 100. It should be noted that FIG. 2 is configured to show the relationship among the signal waveforms of the nodes (i.e., node P, node Q, node E, node F, node G, node H, node I and node J), so the time delay is not considered in FIG. 2.

Figure 3:
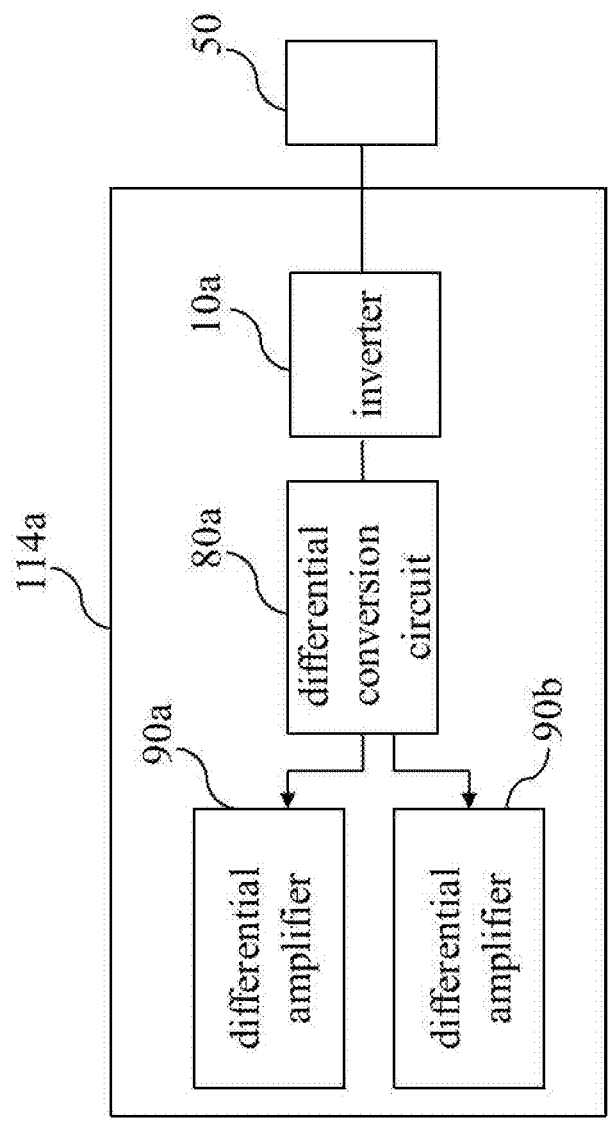
FIG. 3 is a schematic diagram of a transmitting circuit disclosed in an embodiment of the present disclosure.

Please refer to FIG. 3. FIG. 3 is a schematic diagram of a transmitting circuit disclosed in an embodiment of the present disclosure. The transmitting circuit 114a may comprise a differential conversion circuit 80a, a pair of differential amplifiers (i.e., the differential amplifier 90a and the differential amplifier 90b) and an inverter 10a, wherein the differential amplifier 90a and the differential amplifier 90b are connected to the differential conversion circuit 80a, and the inverter 10a is connected to the input/output terminal 50 of the digital isolator 100 and the differential conversion circuit 80a. When the transceiver circuit 110a operates in the transmission mode, the inverter 10a can be configured as a buffer for the transmission circuit 114a to receive the square wave signal from the input/output terminal 50 of the digital isolator 100; the differential conversion circuit 80a can be configured to receive the square wave signal from the input/output terminal 50 of the digital isolator 100 and then perform differential conversion processing to output the positive differential square wave signal and negative differential square wave signal; and the differential amplifier 90a can be configured to amplify the positive differential square wave signal, and the differential amplifier 90b can be configured to amplify the negative differential square wave signal. It should be noted that since the design of the transmitting circuit 114b can be the same as that of the transmitting circuit 114a, it will not be repeated here.

Figure 4:
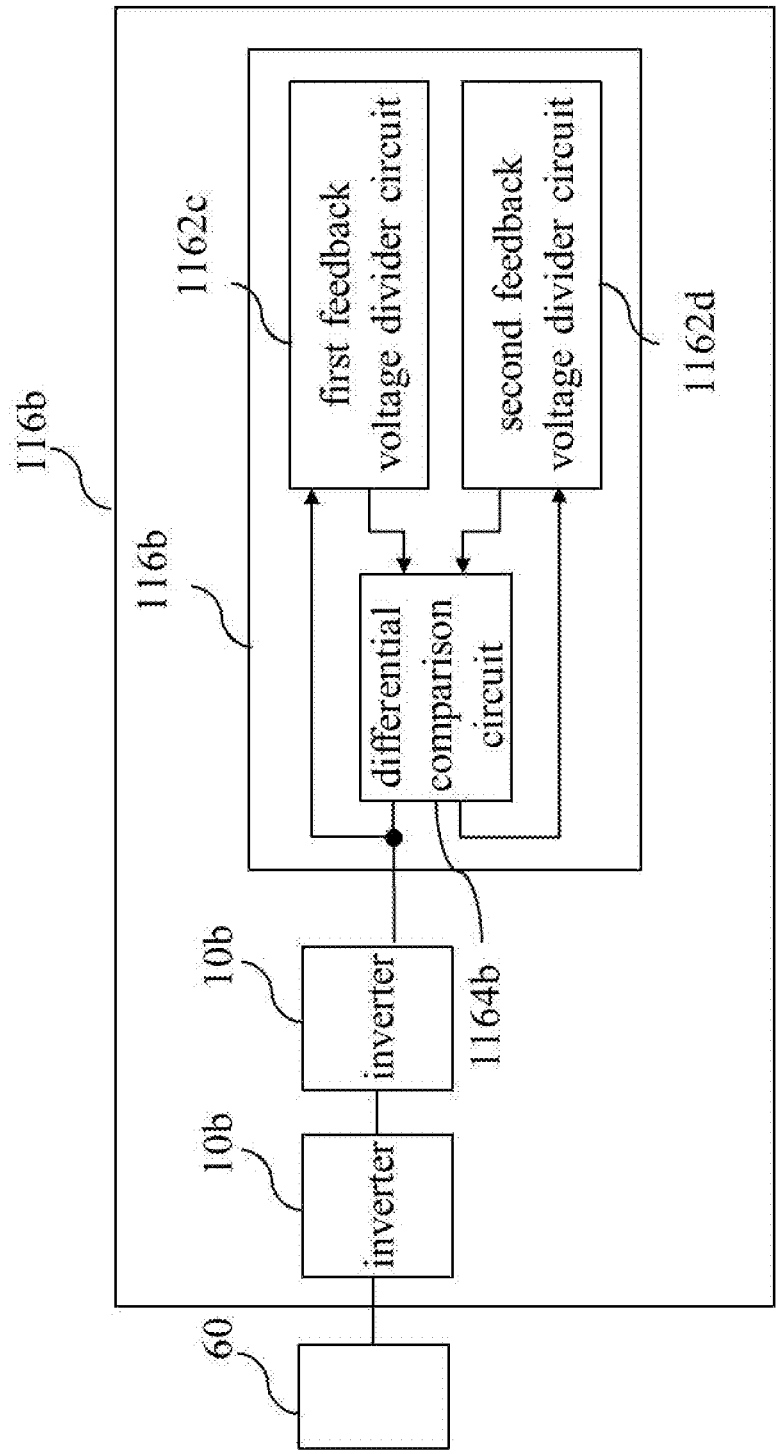
FIG. 4 is a schematic diagram of a receiving circuit disclosed in an embodiment of the present disclosure.

Please refer to FIG. 1 and FIG. 4. FIG. 4 is a schematic diagram of a receiving circuit disclosed in an embodiment of the present disclosure. The receiving circuit 116b may further comprise an inverter 10b and an inverter 10c connected in series, and is connected to the input/output terminal 60 of the digital isolator 100 and the differential comparison circuit 1164b. When the transceiver circuit 110b operates in the receiving mode, the inverter 10b and the inverter 10c connected in series are configured as buffers for the receiving circuit 116b to output the square wave signal from the differential comparison circuit 1164b to the input/output terminal 60 of the digital isolator 100. It should be noted that since the design of the receiving circuit 116a can be the same as that of the receiving circuit 116b, it will not be repeated here.

Figure 5A:
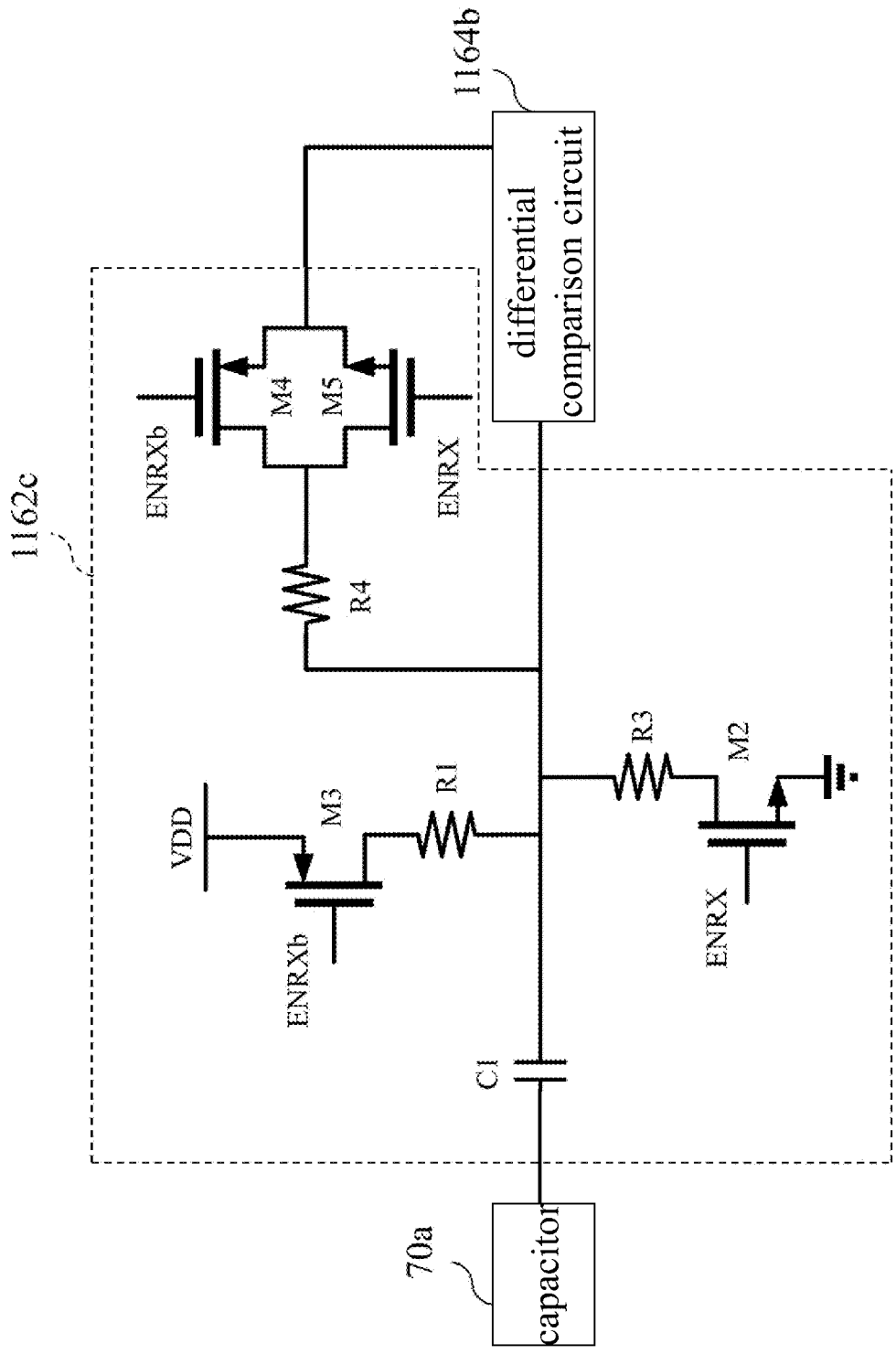
FIG. 5A is a schematic diagram of a first feedback voltage divider circuit disclosed in a first embodiment of the present disclosure.

Please refer to FIG. 1 and FIG. 5A. FIG. 5A is a schematic diagram of a first feedback voltage divider circuit disclosed in a first embodiment of the present disclosure. In FIG. 5A, the first feedback voltage divider circuit 1162c can comprise two P-channel MOSFETs (PMOSs) (i.e., a PMOS M3 and a PMOS M4), and two N-channel MOSFETs (NMOSs) (i.e., a NMOS M2 and a NMOS M5), a capacitor C1 and three resistors (i.e., a resistor R1, a resistor R3, and a resistor R4), wherein ENRX and ENRXb are a pair of power control signals, phases of which are reverse each other, and function as the power switches of the first feedback voltage divider circuit 1162c. The first feedback voltage divider circuit 1162c uses the amplitude of the positive differential voltage division signal received and the amplitude of the positive differential comparison signal feedbacked by the differential comparison circuit 1164b to change the connection relationships among the resistor R1, the resistor R3 and the resistor R4, thereby changing the amplitude of the output positive differential voltage division signal.

Figure 5B:
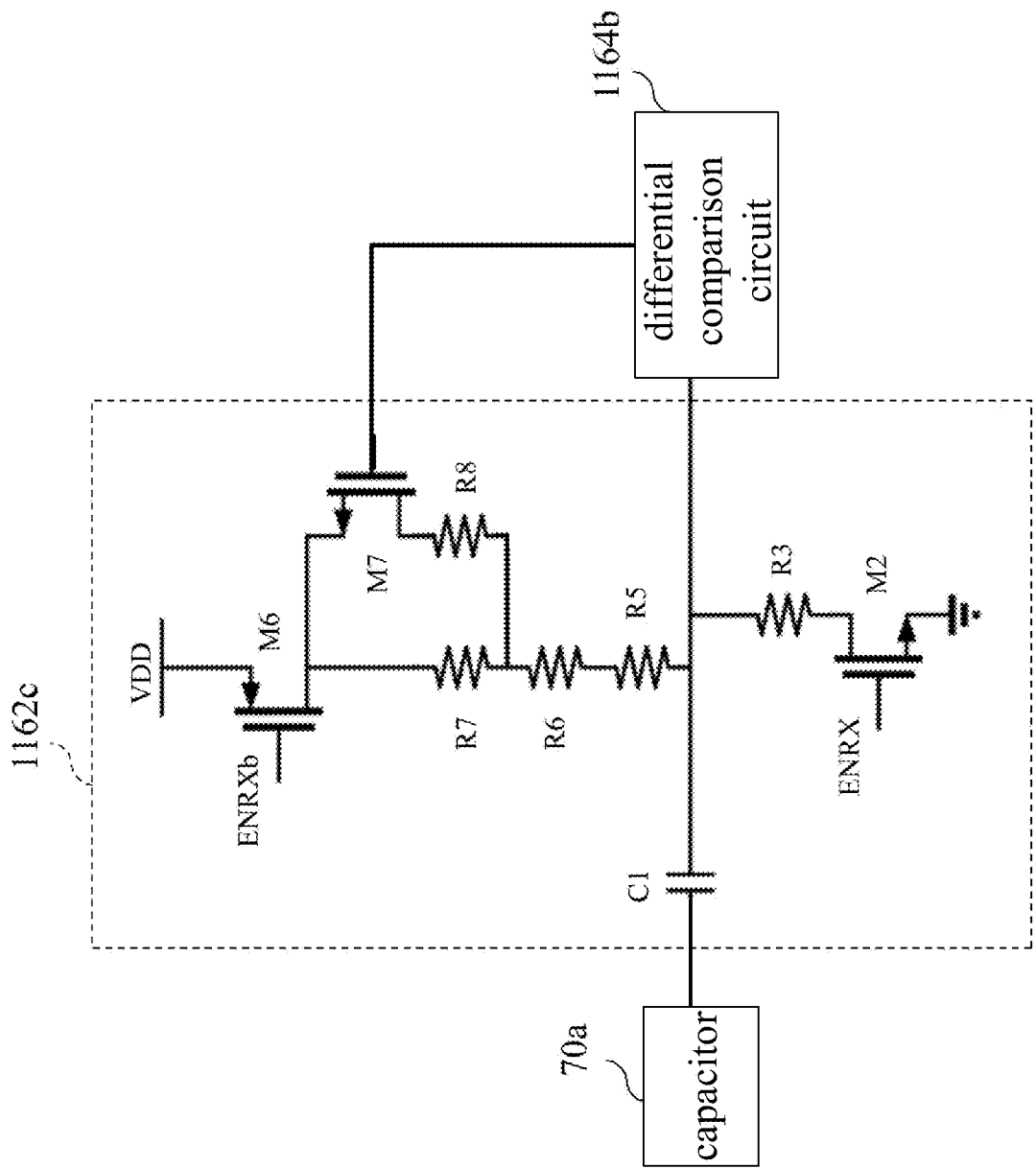
FIG. 5B is a schematic diagram of a first feedback voltage divider circuit disclosed in a second embodiment of the present disclosure.

Please refer to FIG. 1 and FIG. 5B. FIG. 5B is a schematic diagram of a first feedback voltage divider circuit disclosed in a second embodiment of the present disclosure. In FIG. 5B, the first feedback voltage divider circuit 1162c can comprise a PMOS M6, two NMOSs (i.e., a NMOS M2 and a NMOS M7), a capacitor C1 and five resistors (i.e., a resistor R3, a resistor R5, a resistor R6, a resistor R7, and a resistor R8), wherein ENRX and ENRXb are a pair of power control signals, phases of which are reverse each other, and function as the power switches of the first feedback voltage divider circuit 1162c. The first feedback voltage divider circuit 1162c uses the amplitude of the positive differential voltage division signal received and the amplitude of the positive differential comparison signal feedbacked by the differential comparison circuit 1164b to change the connection relationships among the resistor R3, the resistor R5, the resistor R6, the resistor R7, and the resistor R8, thereby changing the amplitude of the output positive differential voltage division signal.

Figure 5C:
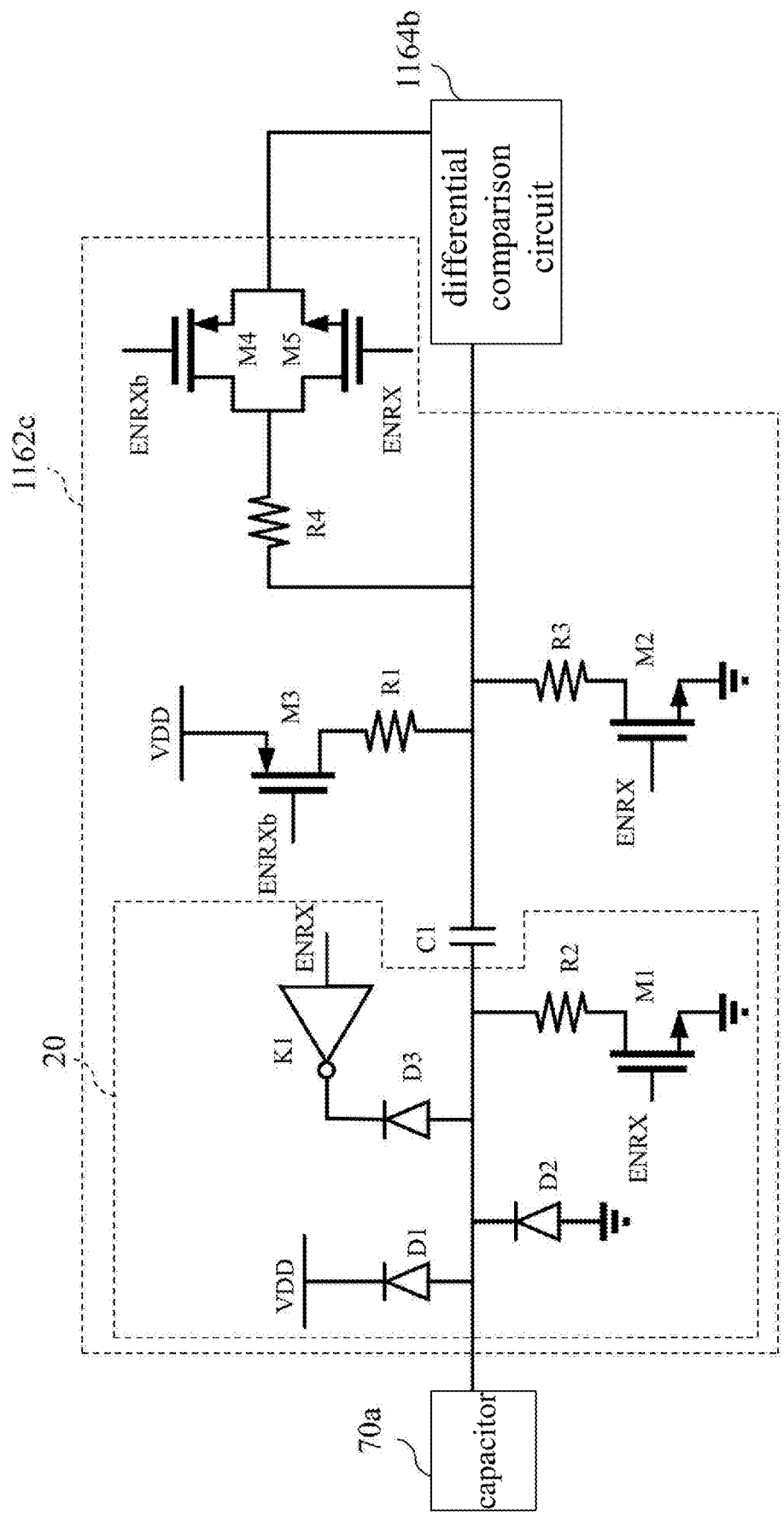
FIG. 5C is a schematic diagram of a first feedback voltage divider circuit disclosed in a third embodiment of the present disclosure.
Figure 5D:
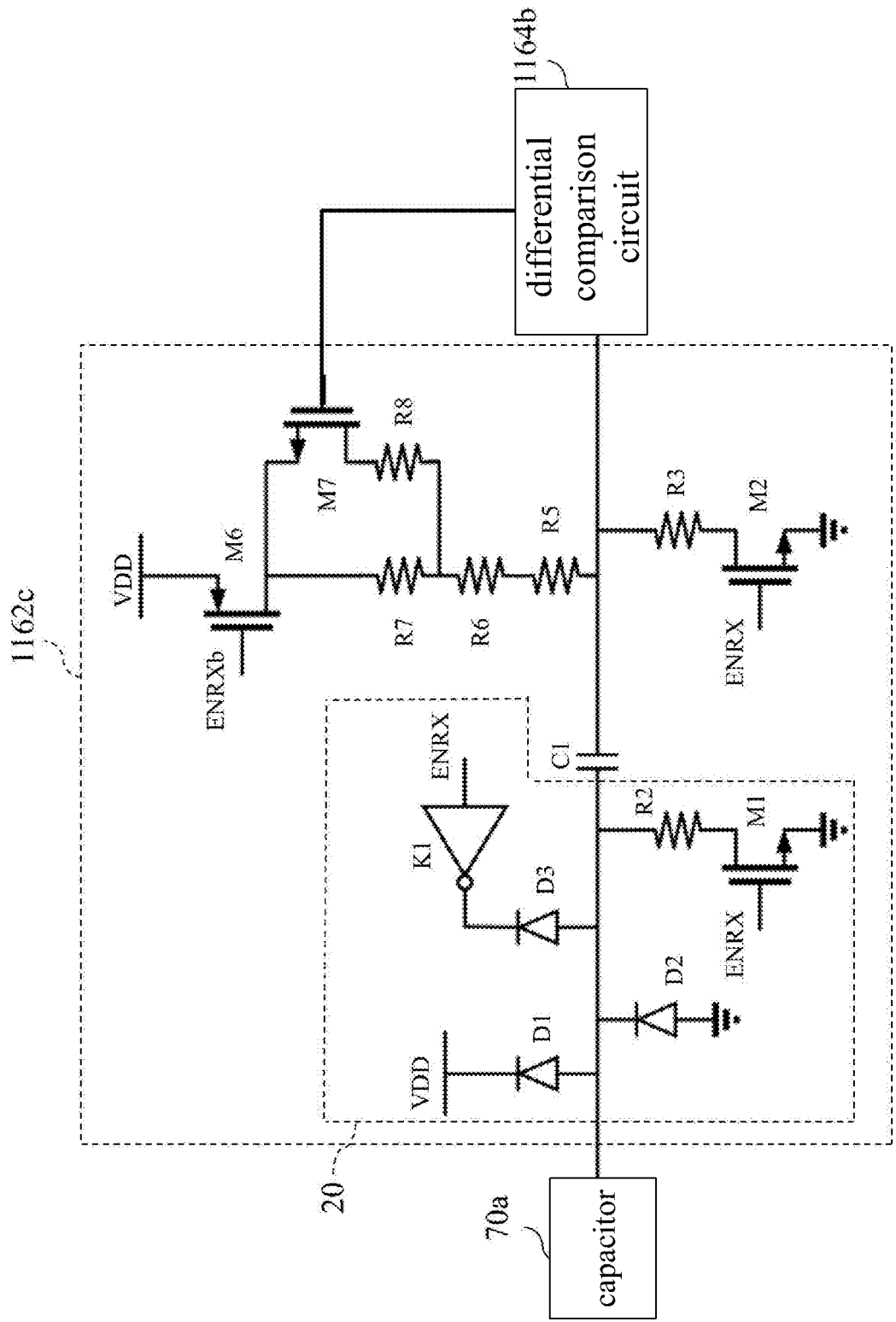
FIG. 5D is a schematic diagram of a first feedback voltage divider circuit disclosed in a fourth embodiment of the present disclosure.

In some embodiments, the first feedback voltage divider circuit 1162c may further comprise an electrostatic discharge (ESD) protection circuit 20, connected to the capacitor 70a. That is, the ESD protection circuit 20 is connected to the DC isolation circuit 112b. The ESD protection circuit 20 is configured to perform electrostatic discharge protection on the first feedback voltage divider circuit 1162c in the transceiver circuit 110b operating in the receiving mode, as shown in FIG. 5C and FIG. 5D, wherein FIG. 5C is a schematic diagram of a first feedback voltage divider circuit disclosed in a third embodiment of the present disclosure, and FIG. 5D is a schematic diagram of a first feedback voltage divider circuit disclosed in a fourth embodiment of the present disclosure. In FIG. 5C and FIG. 5D, the ESD protection circuit 20 comprises an NMOS M1, an inverter K1, three diodes (i.e., a diode D1, a diode D2, and a diode D3) and a resistor R2.

It should be noted that since the design of the first feedback voltage divider circuit 1162a, the second feedback voltage divider circuit 1162b, and the second feedback voltage divider circuit 1162d can be the same as the first feedback voltage divider circuit 1162c, they will not be repeated here.

Figure 6:
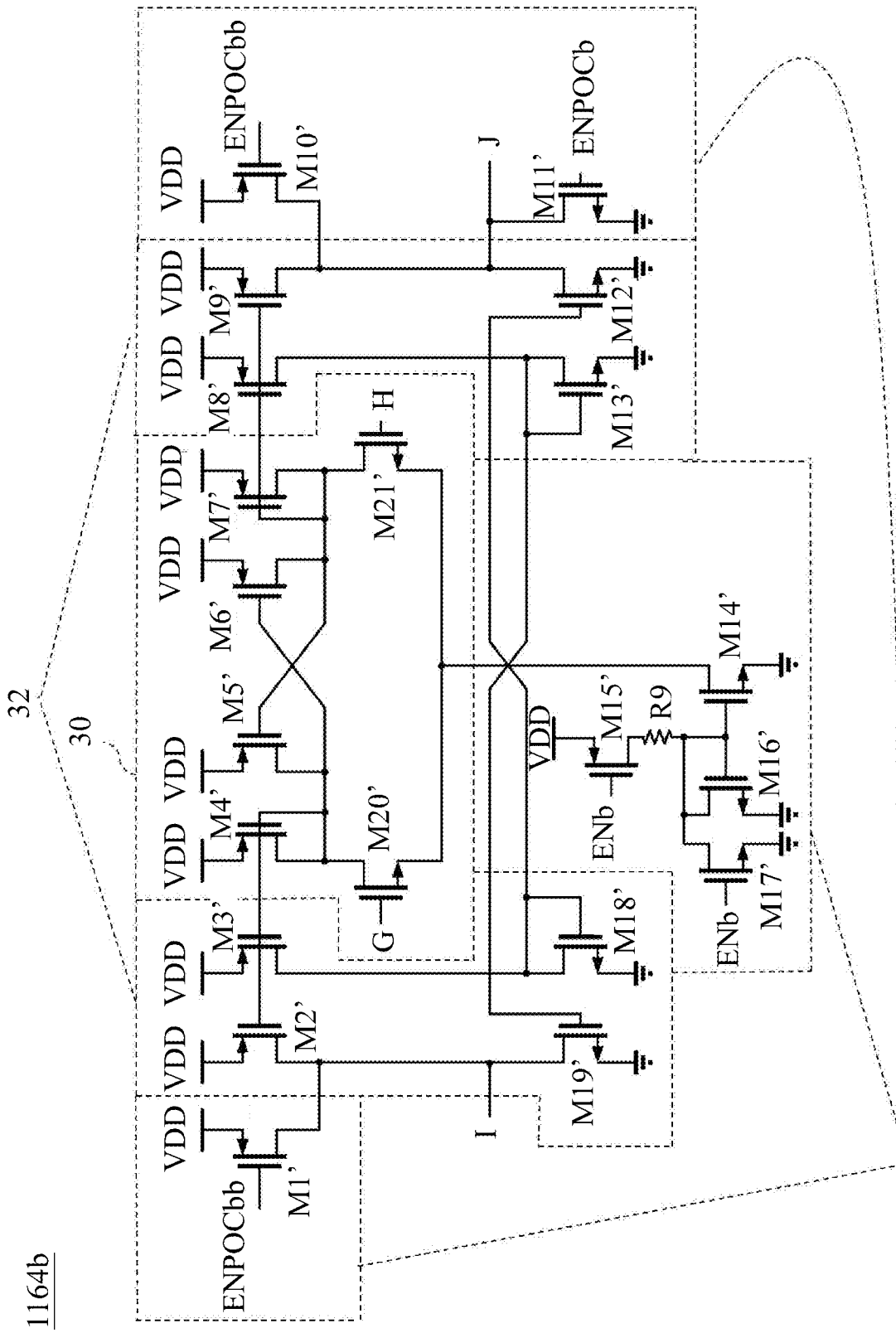
FIG. 6 is a schematic diagram of a differential comparison circuit disclosed in an embodiment of the present disclosure.

Please refer to FIG. 1 and FIG. 6. FIG. 6 is a schematic diagram of a differential comparison circuit disclosed in an embodiment of the present disclosure. The differential comparison circuit 1164b may comprise: a comparison circuit 30, a differential amplifier circuit 32 and a bias circuit 34. In the transceiver circuit 110b operating in the receiving mode, the comparison circuit 30 can be configured to output the positive differential voltage comparison signal and the negative differential comparison signal after comparing the positive differential voltage division signal from the first feedback voltage divider circuit 1162c (i.e., the signal of node G in FIG. 1) and the negative differential voltage division signal from the second feedback voltage divider circuit 1162d (i.e., the signal of node H in FIG. 1); the differential amplifier circuit 32 is connected to the comparison circuit 30 and can be configured to amplify the positive differential comparison signal and the negative differential comparison signal (i.e., the signals of node I and node J in FIG. 1) and then output to the first feedback voltage divider circuit 1162c and the second feedback voltage divider circuit 1162d; and the bias circuit 34 can be configured to provide the bias signal to the comparison circuit 30 and the differential amplifier circuit 32.

In FIG. 6, Enb, ENPOCbb and ENPOCb are the power control signals of the differential comparison circuit 1164b, which function as the power switches of the differential comparison circuit 1164b, and phases of ENPOCb and ENPOCbb are reverse each other. The comparison circuit 30 comprises a PMOS M4', a PMOS M5', a PMOS M6', a PMOS M7', a NMOS M20' and a NMOS M21', the differential amplifier circuit 32 comprises a PMOS M2', a PMOS M3', a PMOS M8', a PMOS M9', a NMOS M19', a NMOS M18', a NMOS M13' and a NMOS M12', and the bias circuit 34 comprises a PMOS M1', a PMOS M10', a PMOS M15', a NMOS M17', a NMOS M16', a NMOS M14', a NMOS M11', and a resistor R9. It should be noted that since the design of the differential comparison circuit 1164a can be the same as that of the differential comparison circuit 1164b, it will not be repeated here.

Figure 7:
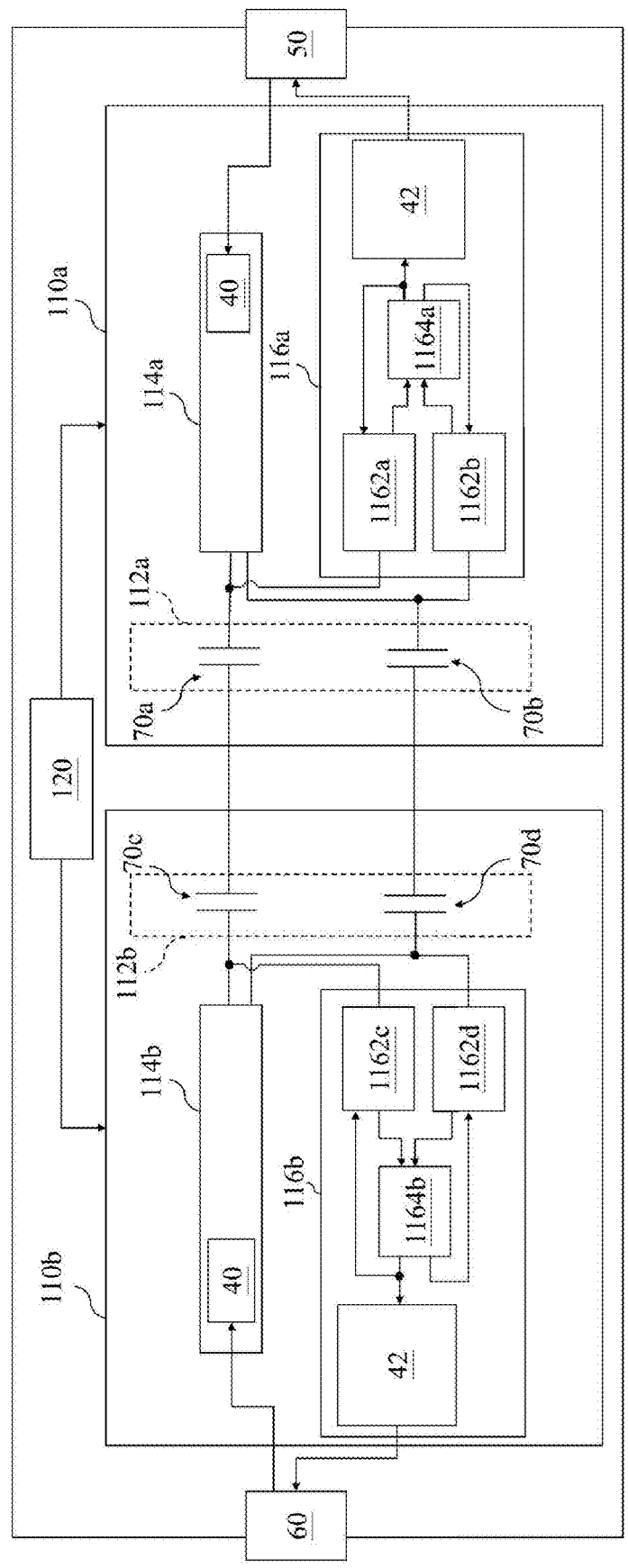
FIG. 7 is a schematic diagram of a digital isolator disclosed in a second embodiment of the present disclosure.

Please refer to FIG. 7. FIG. 7 is a schematic diagram of a digital isolator disclosed in a second embodiment of the present disclosure. The difference between the digital isolator 200 disclosed in the second embodiment and the digital isolator 100 disclosed in the first embodiment is that, in the digital isolator 200, the transmitting circuit 114a may further comprise a transmitting on-off keying (OOK) unit 40 connected to the input/output terminal 50 of the digital isolator 200, and the receiving circuit 116b may further comprise a receiving OOK unit 42 connected to the differential comparison circuit 1164b and the input/output terminal 60 of the digital isolator 200, wherein the transmitting circuit 114a is configured to receive and modulate a square wave signal from the input/output terminal 50 of the digital isolator 200 when the transmitting OOK unit 40 is enabled in the transceiver circuit 110a operating in the transmitting mode to generate the positive differential square wave signal and the negative differential square wave signal, so that the frequencies of the positive differential square wave signal and the negative differential square wave signal in the second embodiment are higher than that of the positive differential square wave signal and the negative differential square wave signal in the first embodiment; and the receiving circuit 116b is configured to demodulate the positive differential comparison signal output by the differential comparison circuit 1164b when the receiving OOK unit 42 is enabled in the transceiver circuit 110b operating in the receiving mode to output the square wave signal, so that the frequency of the positive differential comparison signal in the second embodiment is higher than that of the positive differential comparison signal in the first embodiment. The control circuit 120 can further be configured to enable or disable the receiving OOK unit 42 and the transmitting OOK unit 40. It should be noted that since the design of the transmitting circuit 114b can be the same as that of the transmitting circuit 114a, and the design of the receiving circuit 116a can be the same as that of the receiving circuit 116b, they will not be repeated here.

The digital isolator 100 and the digital isolator 200 of the above embodiments only comprise a pair of transceiver circuits, but these embodiments are not intended to limit the present disclosure. For example, the digital isolator of the present disclosure may comprise multiple pairs of transceiver circuits. Since the digital isolator with a pair of transceiver circuits can function as a single-channel digital isolator, the digital isolator with multiple pairs of transceiver circuits can function as a multi-channel digital isolator. Each transceiver circuit of the digital isolator of the present disclosure can be controlled by the control circuit to operate in the transmitting mode or the receiving mode, and it is not necessary to make different digital isolators to meet the needs of users for different channel direction configurations of input and output signals.

Figure 8:
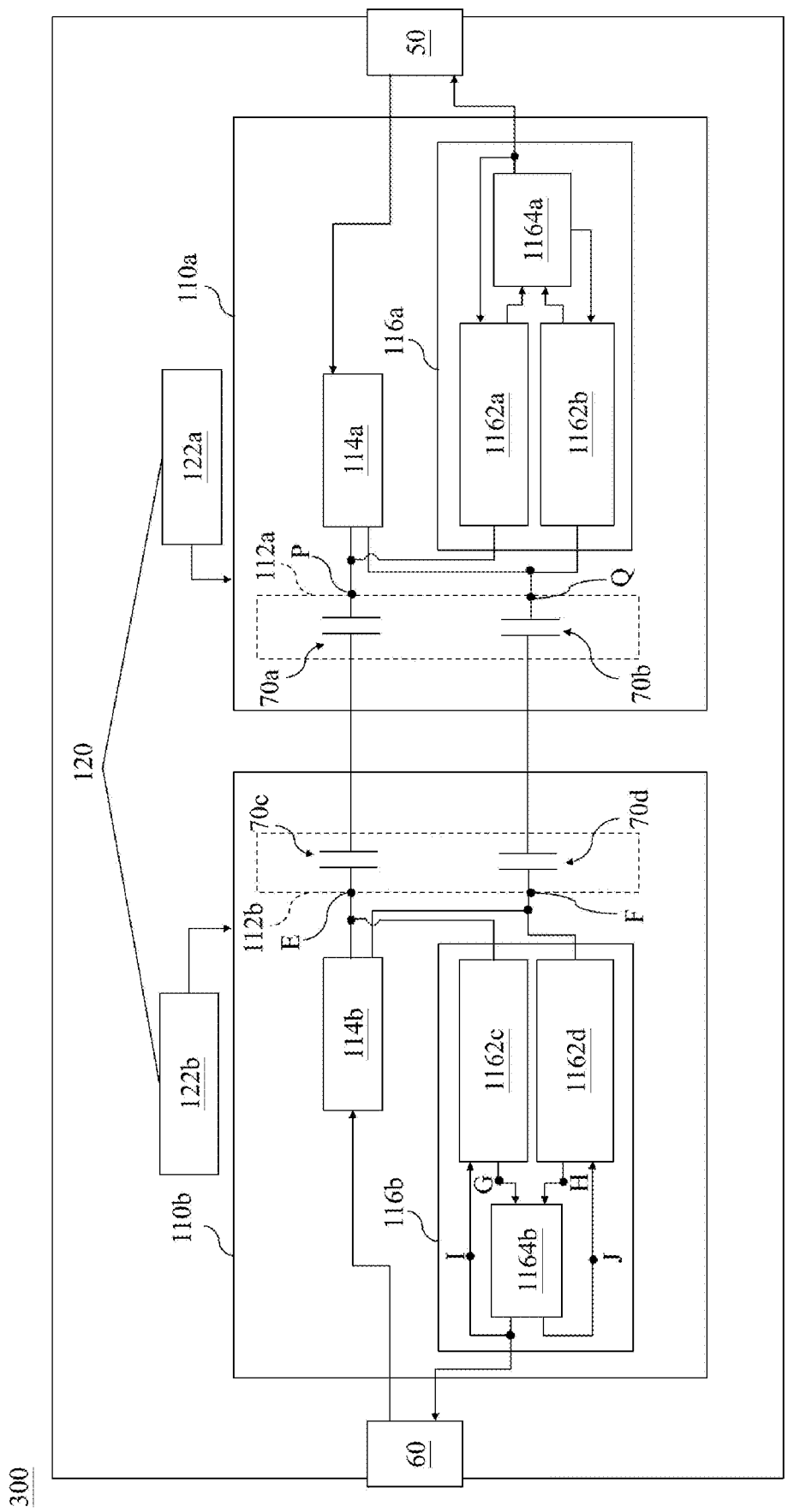
FIG. 8 is a schematic diagram of a digital isolator disclosed in a third embodiment of the present disclosure.

In addition, please refer to FIG. 8. FIG. 8 is a schematic diagram of a digital isolator disclosed in a third embodiment of the present disclosure. The difference between the digital isolator 300 of this embodiment and the digital isolator 100 of the first embodiment is that the control circuit 120 of this embodiment may further comprise a first control unit 122a and a second control unit 122b. In some embodiments, when the first control unit 122a controls the transceiver circuit 110a to operate in the receiving mode, the second control unit 122b controls the transceiver circuit 110b to operate in the transmitting mode. In some embodiments, when the first control unit 122a controls the transceiver circuit 110a to operate in the transmitting mode, the second control unit 122b controls the transceiver circuit 110b to operate in the receiving mode.

In summary, the digital isolator disclosed in the present disclosure can adjust its signal transmission direction according to user needs by the design of connecting two identical transceiver circuits to each other, and controlling one of the transceiver circuits to operate in the transmitting mode and the other of the transceiver circuits to operate in the receiving mode through the control circuit. In addition, the transmitting circuit, the receiving circuit and the DC isolation circuit of each transceiver circuit can be integrated, and the wires are configured to connect the two transceiver circuits to form the digital isolator disclosed in the present disclosure, so, in the production process of the digital isolator, there is no additional DC isolation circuit and no special manufacturing process required, thereby making the manufacturing process of digital isolators easier. Furthermore, the voltage difference between the circuits in different voltage domains that the digital isolator disclosed in the present disclosure can load is increased by the design of connecting two transceiver circuits with each other through the DC isolation circuits. Moreover, the digital isolator disclosed in the present disclosure can use the differential signal transmission technology of the transceiver circuits to solve the problems of the prior art that the square wave signal that can inputted to the digital isolator has a relatively low frequency, and the signal is easily affected by noise due to the large attenuation during transmission.

Although the present invention has been explained in relation to its preferred embodiment, it does not intend to limit the present invention. It will be apparent to those skilled in the art having regard to this present invention that other modifications of the exemplary embodiments beyond those embodiments specifically described here may be made without departing from the spirit of the invention. Accordingly, such modifications are considered within the scope of the invention as limited solely by the appended claims.

What is claimed is:

1. A digital isolator, comprising:
a pair of transceiver circuits, each transceiver circuit operating in one of a receiving mode and a transmitting mode, and comprising a transmitting circuit, a receiving circuit, and a DC isolation circuit connected to the transmitting circuit, the receiving circuit, each receiving circuit comprising a first feedback voltage divider circuit, a second feedback voltage divider circuit, and a differential comparison circuit connected to the first feedback voltage divider circuit and the second feedback voltage divider circuit respectively, wherein the DC isolation circuits are connected to each other; and
a control circuit connected to the pair of transceiver circuits, configured to control one of the pair of transceiver circuits to operate in the transmitting mode, and control the other of the pair of transceiver circuits to operate in the receiving mode, so that the transmitting circuit of the transceiver circuit operating in the transmitting mode configured to receive a square wave signal from an input/output terminal of the digital isolator, and then generate a positive differential square wave signal and a negative differential square wave signal; the connected DC isolation circuits configured to generate a positive differential coupling signal and a negative differential coupling signal after receiving the positive differential square wave signal and the negative differential square wave signal; and in the receiving circuit of the transceiver circuit operating in the receiving mode, the first feedback voltage divider circuit configured to output a positive differential voltage division signal to the differential comparison circuit based on the positive differential coupling signal and a positive differential comparison signal, and the second feedback voltage divider circuit configured to output a negative differential voltage division signal to the differential comparison circuit based on the negative differential coupling signal and a negative differential comparison signal, and the differential comparison circuit configured to compare the positive differential voltage division signal with the negative differential voltage division signal and then feedback the positive differential comparison signal to the first feedback voltage divider circuit and feedback the negative differential comparison signal to the second feedback voltage divider circuit, and output the positive differential comparison signal which is the same as the square wave signal through the other input/output terminal of the digital isolator.

2. The digital isolator according to claim 1, wherein, in each of the pair of transceiver circuits, the DC isolation circuit comprises a pair of capacitors or a pair of inductors connected to the transmitting circuit and the receiving circuit respectively.

3. The digital isolator according to claim 1, wherein each transmission circuit comprises: a differential conversion circuit and a pair of differential amplifiers connected to the differential conversion circuit, in the transceiver circuit operating in the transmitting mode, the differential conversion circuit is configured to perform a differential conversion process on the square wave signal from the input/output terminal of the digital isolator to output the positive differential square wave signal and the negative differential square wave signal; the pair of differential amplifiers are configured to amplify the positive differential square wave signal and the negative differential square wave signal.

4. The digital isolator according to claim 3, wherein each transmitting circuit further comprises an inverter connected to the input/output terminal of the digital isolator and the differential conversion circuit, and in the transceiver circuit operating in the transmission mode, the inverter functions as a buffer for receiving the square wave signal from the input/output terminal of the digital isolator.

5. The digital isolator according to claim 1, wherein each transmitting circuit comprises a transmitting on-off keying (OOK) unit connected to the input/output terminal of the digital isolator, and the transmitting circuit of the transceiver circuit operating in the transmitting mode is configured to generate the positive differential square wave signal and the negative differential square wave signal after receiving and modulating the square wave signal from the input/output terminal of the digital isolator when the transmitting OOK unit is enabled; each receiving circuit further comprises a receiving OOK unit connected to the differential comparison circuit, and the receiving circuit of the transceiver circuit operating in the transmitting mode is configured to demodulate the positive differential comparison signal output by the differential comparison circuit to output the square wave signal when the receiving OOK unit is enabled.

6. The digital isolator according to claim 5, wherein the control circuit is further configured to enable or disable the receiving OOK unit and the transmitting OOK unit.

7. The digital isolator according to claim 1, wherein each receiving circuit further comprises two inverters connected in series, connected to the differential comparison circuit, for functioning as buffers to the other input/output terminal of the digital isolator in the transceiver circuit operating in the receiving mode when the receiving circuit outputs the square wave signal from the differential comparison circuit.

8. The digital isolator according to claim 1, wherein each differential comparison circuit comprises: a comparison circuit, a differential amplifier circuit connected to the comparison circuit, and a bias circuit connected to the comparison circuit; and in the transceiver circuit operating in the receiving mode, the comparison circuit is configured to compare the positive differential voltage division signal from the first feedback voltage divider circuit and the negative feedback voltage division signal from the second feedback voltage divider and then output the positive differential comparison signal and the negative differential comparison signal; the differential amplifying circuit is configured to amplify the positive differential comparison signal and the negative differential comparison signal and then output to the first feedback voltage divider circuit and the second feedback voltage divider circuit connected; and the bias circuit is configured to provide a bias signal to the comparison circuit and the differential amplifier circuit.

9. The digital isolator according to claim 1, wherein the digital isolator comprises multiple pairs of transceiver circuits.

10. The digital isolator according to claim 1, wherein the control circuit comprises a first control unit and a second control unit, and when the first control unit controls one of the pair of transceiver circuits to operate in the receiving mode, the second control unit controls the other of the pair of transceiver circuits to operate in the transmitting mode; and when the first control unit controls one of the pair of transceiver circuits to operate in the transmitting mode, the second control unit controls the other of the pair of transceiver circuits to operate in the receiving mode.

11. The digital isolator according to claim 1, wherein each first feedback voltage divider circuit and each second feedback voltage divider circuit comprises an electrostatic discharge (ESD) protection circuit connected to the DC isolation circuit for performing electrostatic discharge on the first feedback voltage divider circuit and the second feedback voltage divider circuit in the transceiver circuit operating in the receiving mode.

\* \* \* \* \*